United States Patent
Tian et al.

(10) Patent No.: US 11,449,989 B2
(45) Date of Patent: Sep. 20, 2022

(54) SUPER-RESOLUTION ANATOMICAL MAGNETIC RESONANCE IMAGING USING DEEP LEARNING FOR CEREBRAL CORTEX SEGMENTATION

(71) Applicant: THE GENERAL HOSPITAL CORPORATION, Boston, MA (US)

(72) Inventors: Qiyuan Tian, Charlestown, MA (US); Susie Yi Huang, Boston, MA (US); Berkin Bilgic, Boston, MA (US); Jonathan R. Polimeni, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 29 days.

(21) Appl. No.: 16/831,061

(22) Filed: Mar. 26, 2020

(65) Prior Publication Data

US 2020/0311926 A1 Oct. 1, 2020

Related U.S. Application Data

(60) Provisional application No. 62/969,610, filed on Feb. 3, 2020, provisional application No. 62/824,574, filed on Mar. 27, 2019.

(51) Int. Cl.
*G06T 7/00* (2017.01)
*G06T 3/40* (2006.01)
*G01R 33/56* (2006.01)
*G06T 7/11* (2017.01)

(52) U.S. Cl.
CPC ........ *G06T 7/0012* (2013.01); *G01R 33/5602* (2013.01); *G06T 3/4007* (2013.01); *G06T 3/4053* (2013.01); *G06T 7/11* (2017.01); *G06T 2207/10088* (2013.01); *G06T 2207/20081* (2013.01); *G06T 2207/20084* (2013.01); *G06T 2207/30016* (2013.01)

(58) Field of Classification Search
CPC . G06T 2207/30016; G06T 2207/20081; G06T 2207/20084
See application file for complete search history.

(56) References Cited

U.S. PATENT DOCUMENTS

| | | | | |
|---|---|---|---|---|
| 5,995,682 A | * | 11/1999 | Pawlicki | ............... G06T 3/4007 |
| | | | | 382/156 |
| 2004/0021424 A1 | * | 2/2004 | Pathak | ...................... G06T 5/20 |
| | | | | 315/169.3 |
| 2008/0170791 A1 | * | 7/2008 | Eskildsen | ................ G06K 9/48 |
| | | | | 382/199 |

(Continued)

OTHER PUBLICATIONS

Ashburner et al., Unified Segmentation, NeuroImage, 2005, 26(3):839-851.

(Continued)

*Primary Examiner* — Gandhi Thirugnanam
(74) *Attorney, Agent, or Firm* — Quarles & Brady LLP

(57) ABSTRACT

Super-resolution images are generated from standard-resolution images acquired with a magnetic resonance imaging ("MRI") system. More particularly, super-resolution (e.g., sub-millimeter isotropic resolution) images are generated from standard-resolution images (e.g., images with 1 mm or coarser isotropic resolution) using a deep learning algorithm, from which accurate cortical surface reconstructions can be generated.

12 Claims, 7 Drawing Sheets

(56) References Cited

U.S. PATENT DOCUMENTS

| | | | |
|---|---|---|---|
| 2018/0075581 A1* | 3/2018 | Shi | G06N 3/0472 |
| 2018/0276820 A1* | 9/2018 | Gibby | A61B 5/7264 |
| 2019/0057488 A1* | 2/2019 | Li | G06T 3/4053 |
| 2019/0196051 A1* | 6/2019 | Wang | G01V 5/0016 |
| 2019/0287292 A1* | 9/2019 | Ceccaldi | G06T 7/11 |
| 2019/0370936 A1* | 12/2019 | Zhang | G06V 10/462 |
| 2020/0043135 A1* | 2/2020 | Chou | G06T 3/4053 |
| 2020/0111194 A1* | 4/2020 | Wang | G06T 3/4076 |
| 2020/0234406 A1* | 7/2020 | Ren | G06N 3/084 |
| 2020/0311926 A1* | 10/2020 | Tian | G01R 33/5608 |

OTHER PUBLICATIONS

Bazin et al., Homeomorphic Brain Image Segmentation with Topological and Statistical Atlases, Medical image Analysis, 2008, 12(5):616-625.

Bazin et al., A Computational Framework for Ultra-High Resolution Cortical Segmentation at 7 Tesla, NeuroImage, 2014, 93:201-209.

Chaudhari et al., Deep Learning Super-Resolution Enables Rapid Simultaneous Morphological and Quantitative Magnetic Resonance Imaging, In International Workshop on Machine Learning for Medical Image Reconstruction, 2018, pp. 3-11.

Chaudhari et al., Super-Resolution Musculoskeletal MRI Using Deep Learning, Magnetic Resonance in Medicine, 2018, 80(5):2139-2154.

Chaudhari et al., Utility of Deep Learning Super-Resolution in the Context of Osteoarthritis MRI Biomarkers, Journal of Magnetic Resonance Imaging, 2020, 51(3):768-779.

Chen et al., Efficient and Accurate MRI Super-Resolution Using a Generative Adversarial Network and 3D Multi-Level Densely Connected Network, In International Conference on Medical Image Computing and Computer-Assisted Intervention, 2018, pp. 91-99.

Dale et al., Cortical Surface-Based Analysis; I. Segmentation and Surface Reconstruction, NeuroImage, 1999, 9 (2):179-194.

Dong et al., Learning a Deep Convolutional Network for Image Super-Resolution, In European Conference on Computer Vision, 2014, pp. 184-199.

Dong et al., Image Super-Resolution Using Deep Convolutional Networks, IEEE Transactions on Pattern Analysis and Machine Intelligence, 2015, 38(2):295-307.

Fischl et al., Cortical Surface-Based Analysis; II: Inflation, Flattening, and a Surface-Based Coordinate System, NeuroImage, 1999, 9(2):195-207.

Fischl et al., Measuring the Thickness of the Human Cerebral Cortex from Magnetic Resonance Images, PNAS, 2000, 97(20):11050-11055.

Fischl et al., Automatically Parcellating the Human Cerebral Cortex, Cerebral Cortex, 2004, 14(1):11-22.

Fischl, FreeSurfer, NeuroImage, 2012, 62(2):774-781.

Freeman et al., Example-Based Super-Resolution, IEEE Computer Graphics and Applications, 2002, pp. 56-65.

Glasner et al., Super-Resolution From a Single Image, In 2009 IEEE 12th International Conference on Computer Vision, pp. 349-356.

Glasser et al., The Minimal Preprocessing Pipelines for the Human Connectome Project, Neuroimage, 2013, 80:105-124.

Glasser et al., A Multi-Modal Parcellation of Human Cerebral Cortex, Nature, 2016, 536(7615):171-178.

Greve et al., Accurate and Robust Brain Image Alignment Using Boundary-Based Registration, Neuroimage, 2009, 48(1):63-72.

He et al., Delving Deep into Rectifiers: Surpassing Human-Level Performance on ImageNet Classification, In Proceedings of the IEEE International Conference on Computer Vision, 2015, pp. 1026-1034.

Kim et al., Automated 3-D Extraction and Evaluation of the Inner and Outer Cortical Surfaces Using a Laplacian Map and Partial Volume Effect Classification, NeuroImage, 2005,27(1):210-221.

Kim et al., Accurate Image Super-Resolution Using Very Deep Convolutional Networks, In Proceedings of the IEEE Conference on Computer Vision and Pattern Recognition, 2016, pp. 1646-1654.

Lai et al., Deep Laplacian Pyramid Networks for Fast and Accurate Super-Resolution, In Proceedings of the IEEE Conference on Computer Vision and Pattern Recognition, 2017, pp. 624-632.

Liu et al., Deep Learning-Based Super-Resolution in Coherent Imaging Systems, Scientific Reports, 2019, 9:3926, pp. 1-13.

McNab et al., Surface Based Analysis of Diffusion Orientation for Identifying Architectonic Domains in the In Vivo Human Cortex, Neuroimage, 2013, 69:87-100.

Ouyang et al., Deep Learning Massively Accelerates Super-Resolution Localization Microscopy, Nature Biotechnology, 2018, 36(5):460-468.

Polimeni et al., Laminar Analysis of 7 T BOLD Using an Imposed Spatial Activation Pattern in Human V1, Neuroimage, 2010, 52(4):1334-1346.

Rivenson et al., Deep Learning Microscopy, Optica, 2017, 4(11):1437-1443.

Ronneberger et al., U-Net: Convolutional Networks for Biomedical Image Segmentation, MICCAI 2015, Part III, LNCS 9351, pp. 234-241.

Simonyan et al., Very Deep Convolutional Networks for Large-Scale Image Recognition, 2014, arXiv preprint arXiv:1409.1556, pp. 1-14.

Tai et al., Image Super-Resolution Via Deep Recursive Residual Network, In Proceedings of the IEEE Conference on Computer Vision and Pattern Recognition, 2017, pp. 3147-3155.

Timofte et al., NTIRE 2017 Challenge on Single Image Super-Resolution: Methods and Results, In Proceedings of the IEEE Conference on Computer Vision and Pattern Recognition Workshops, 2017, pp. 114-125.

Wang et al., Deep Learning Enables Cross-Modality Super-Resolution in Fluorescence Microscopy, Nature Methods, 2019, 16(1):103-110.

Zaretskaya et al., Advantages of Cortical Surface Reconstruction Using Submillimeter 7 T MEMPRAGE, Neuroimage, 2018, 165:11-26.

Zhang et al., Beyond a Gaussian Denoiser: Residual Learning of Deep CNN for Image Denoising, IEEE Transactions on Image Processing, 2017, 26(7):3142-3155.

Zhang et al., Enhancing Hi-C Data Resolution with Deep Convolutional Neural Network HiCPlus, Nature Communications, 2018, 9(1):1-9.

Zhu et al., Super-Resolution Reconstruction and Its Application Based on Multilevel Main Structure and Detail Boosting, Remote Sensing, 2018, 10:2065, 23 pages.

* cited by examiner

SUPER-RESOLUTION ANATOMICAL MAGNETIC RESONANCE IMAGING USING DEEP LEARNING FOR CEREBRAL CORTEX SEGMENTATION

CROSS-REFERENCE TO RELATED APPLICATIONS

This application claims the benefit of U.S. Provisional Patent Application Ser. No. 62/824,574, filed on Mar. 27, 2019, and entitled "SUPER-RESOLUTION ANATOMICAL MAGNETIC RESONANCE IMAGING USING DEEP LEARNING FOR CEREBRAL CORTEX SEGMENTATION," and U.S. Provisional Patent Application Ser. No. 62/969,610, filed on Feb. 3, 2020, and entitled "SUPER-RESOLUTION ANATOMICAL MAGNETIC RESONANCE IMAGING USING DEEP LEARNING FOR CEREBRAL CORTEX SEGMENTATION," both of which are herein incorporated by reference in their entirety.

STATEMENT REGARDING FEDERALLY SPONSORED RESEARCH

This invention was made with government support under RR019307, N5096056, and MH111419 awarded by the National Institutes of Health. The government has certain rights in the invention.

BACKGROUND

The morphology of the human cerebral cortex is both highly variable within and across individuals and can change and adapt over the lifetime, reflecting both normal developmental changes and pathology. For example, cortical thinning has been observed in normal aging, neurodegeneration, and a number of neurological and psychiatric disorders, while cortical thickening has been found to correlate with cortical plasticity and remodeling.

In vivo measurements of cortical structure require the precise delineation of both of its borders, the inner (i.e., the gray matter-white matter interface) and outer (i.e., the gray matter-cerebrospinal fluid ("CSF") interface) boundaries of the cerebral cortex. These bounding surfaces are typically represented as two-dimensional surface meshes generated from anatomical magnetic resonance imaging (MRI) data through a process known as cortical surface reconstruction. The pairs of the reconstructed cortical surfaces (herein called the gray-white and gray-CSF surfaces, respectively) are useful for cortical morphometric quantification, including determining regional cortical thickness, volume, surface area, and gyrification. They can also be utilized for parcellating cortical areas, for providing a constraint to drive alignment between imaging data, and for visualizing and analyzing two-dimensional patterns of anatomical, microstructural, and functional signals natively on the folded cortical manifold as well as across cortical depths and layers. Currently, cortical surface reconstruction can be performed automatically and routinely using software packages such as FreeSurfer, CIVET, CBS Tools, TOADS-CRUISE Brain Segmentation Tools, and Brain Voyager.

Standard anatomical MRI data (typically T1-weighted images, which exhibit superior gray-white and gray-CSF contrasts) acquired for cortical surface reconstruction often utilize 1-mm isotropic spatial resolution, which provides a practical trade-off between acquisition time and image quality. Reconstruction methods used in tools such as FreeSurfer or CIVET can generate cortical surfaces with sub-millimeter accuracy from 1-mm isotropic resolution data by accounting for partial volume effects at the cortical boundaries, given that both the radius of curvature and thickness of the human cortex are greater than 1 mm. Consequently, 1-mm isotropic resolution has long been believed to be sufficient for accurate cortical surface reconstruction.

Recent studies indicate that pushing the spatial resolution of anatomical MR images to sub-millimeter voxel sizes can further improve the cortical surface placement and thickness estimation by reducing partial volume effects. With sub-millimeter images, the reconstructed gray-white and gray-CSF surfaces are generally placed more interior, and the cortex is estimated to be slightly thinner in most areas, while relatively thicker estimates are found in heavily myelinated cortical regions such as the sensory cortices, including the primary somatosensory, visual, and auditory cortex. To benefit from more accurate cortical surfaces reconstructed at sub-millimeter resolution, T1-weighted MRI data can be acquired.

Despite the demonstrated value of sub-millimeter cortical surface reconstruction, sub-millimeter data acquisition requires much longer scan time compared to a standard 1-mm isotropic acquisition for two reasons. First, it takes slightly longer to encode smaller voxel sizes, which requires a greater number of data samples within a whole-brain volume (e.g., normally ~5 min for a 1-mm isotropic protocol versus ~8 min for a 0.7-mm isotropic protocol). What is more time consuming is the common practice of repeating the same sub-millimeter acquisition to average the data to reduce noise. The MRI signal level is directly proportional to the volume of each brain voxel, which drops substantially from 1-mm to sub-millimeter isotropic resolution (e.g., a factor of 2.92 from 1-mm to 0.7-mm isotropic resolution). In order to recover the same signal-to-noise ratio (SNR), the number of the repetitions required is the square of the volume reduction factor (e.g., 8.5 repetitions are needed from 1-mm to 0.7-mm isotropic resolution). The lower SNR seen in these higher-resolution acquisitions leads to errors in the surface reconstruction, which can be offset by averaging more data with the trade-off of longer acquisition time.

However, lengthy acquisitions are more vulnerable to image blurring and ringing artifacts caused by motion and impose a significant barrier to performing sub-millimeter surface reconstruction in some patient populations and in elderly subjects and children who cannot tolerate long scans. Ultra-high field MRI scanners can considerably improve image quality by boosting sensitivity, but are expensive and less accessible. Furthermore, poor MRI data quality in the temporal lobe at ultra-high field strengths cannot support accurate surface reconstruction in this region, thereby preventing whole-brain analyses. In addition, many existing large-scale brain anatomical datasets have already been acquired at a standard 1-mm isotropic spatial resolution, such as those acquired in the Alzheimer's Disease Neuroimaging Initiative (ADNI), the Parkinson Progression Marker Initiative (PPMI), the Adolescent Brain Cognitive Development (ABCD) Study, and the UK Biobank Imaging Study.

SUMMARY OF THE DISCLOSURE

The present disclosure addresses the aforementioned drawbacks by providing a method for generating a cortical surface reconstruction from standard-resolution magnetic resonance images. The method includes accessing standard-resolution magnetic resonance image data with a computer system, wherein the standard-resolution magnetic resonance image data depict a brain of a subject, and generating upsampled image data with the computer system by upsampling the standard-resolution magnetic resonance image data to a target spatial resolution that is finer than the standard resolution. A neural network is accessed with the computer system, wherein the neural network has been trained on training data to learn a mapping from upsampled image data to native high-resolution image data. The upsampled image data are input to the neural network using the computer system, generating output as residual image data that represent image differences relative to the upsampled image data. Super-resolution image data are generated by combining the upsampled image data and the residual image data, and a cortical surface reconstruction is generated from the super-resolution image data, wherein the cortical surface reconstruction represents a three-dimensional representation of a cortical surface of the brain of the subject.

It is another aspect of the present disclosure to provide a method for training and implementing a neural network to generate super-resolution magnetic resonance images from lower resolution magnetic resonance images. Training data are accessed with a computer system, where the training data include first image data having a first spatial resolution representative of a native high resolution; second image data having a second spatial resolution that is coarser than the first spatial resolution, wherein the second image data are generated by downsampling the first image data; and third image data having a third spatial resolution representative of an upsampled high resolution, wherein the third image data are generated by upsampling the second image data. A neural network is trained on the training data by minimizing a loss function using the computer system, generating a trained neural network that learns a mapping between the native high resolution and the upsampled high resolution. Magnetic resonance images are acquired from a subject using a magnetic resonance imaging (MRI) system, wherein the magnetic resonance images have the second spatial resolution and depict a brain of the subject. Upsampled images are generated by upsampling the magnetic resonance images using the computer system, wherein the upsampled images have the third spatial resolution. The upsampled images are inputted to the trained neural network, generating output as residual images representing a difference between the upsampled high resolution and the native high resolution, and super-resolution images are generated with the computer system by combining the residual images and the upsampled images, wherein the super-resolution images have the first spatial resolution.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
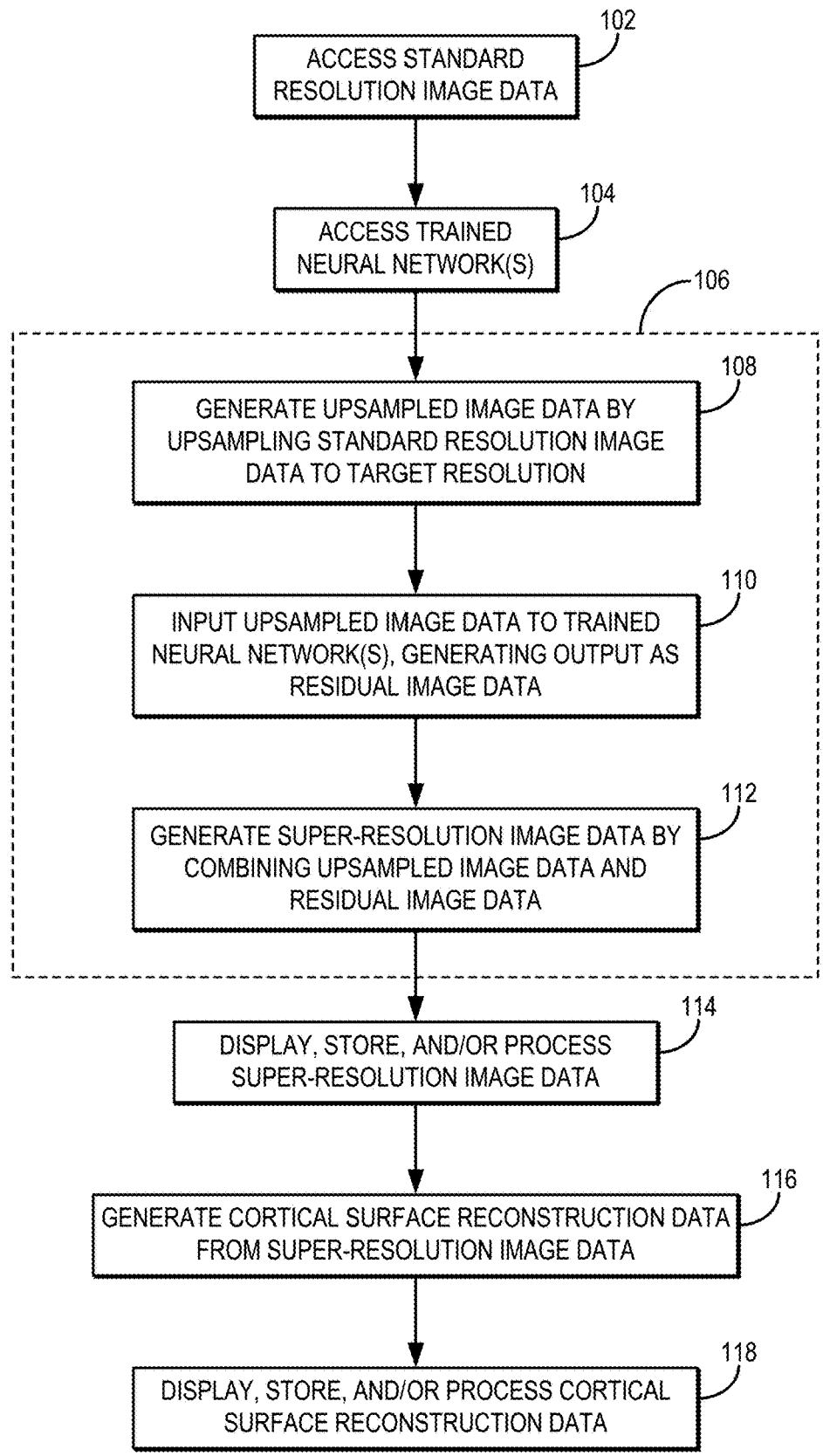
FIG. 1 a flowchart of an example method for generating a cortical reconstruction from super-resolution images generated based on inputting standard-resolution images to a suitably trained neural network.

Described here are systems and methods for generating super-resolution images from lower resolution images acquired with a magnetic resonance imaging ("MRI") system. More particularly, super-resolution (e.g., sub-millimeter isotropic resolution) images are generated from lower resolution images (e.g., images with 1 mm isotropic resolution) using a deep learning algorithm, from which accurate cortical surface reconstructions can be generated.

The systems and methods described in the present disclosure are particularly advantageous for brain imaging applications, where super-resolution images can be synthesized to achieve comparable cortical surface reconstruction performance attainable with native sub-millimeter anatomical MRI data. In this way, the described methods improve upon existing MRI techniques by reducing the long acquisition time otherwise required to obtain sub-millimeter anatomical MRI data, which in turn decreases the scan cost while increasing the motion robustness of the scan and patient comfort.

For example, using the described methods cortical surfaces can be reconstructed with improved accuracy relative to anatomical MRI data acquired with standard spatial resolutions. Anatomical measures can then be derived from the cortical surface reconstruction (e.g., cortical thickness) with higher precision and/or accuracy than compared to cortical reconstructions obtained from standard-resolution images. Further still, the super-resolution images also enable improvements to cortical surface-based visualization and analysis of data and measurements from methods such as diffusion MRI, functional MRI, and positron-emission tomography. Additionally or alternatively, the described methods enable improvement to image co-registration techniques that utilize cortical surfaces for clinical purposes of diagnosis, prognosis, and treatment, as well as for scientific purposes in neuroscientific, neurological, neurosurgical, psychiatric, and psychological research.

It is an aspect of the present disclosure to provide a method for data-driven deep learning-based generation of super-resolution images. The deep learning algorithms implemented in these methods can be trained based on suitable training data, which in some instances may include large-scale brain MRI databases, to improve in vivo human cerebral cortical surface reconstruction. The described methods, therefore, have the ability to leverage existing datasets for a more detailed understanding of human brain structure and function, while avoiding the long acquisition times required to obtain sub-millimeter anatomical MRI data.

Using the systems and methods described in the present disclosure, more accurate cortical surface estimations can be obtained from standard-resolution (e.g., 1 mm isotropic) magnetic resonance images, such as T1-weighted images. For instance, from the super-resolution images generated by the trained neural network(s), cortical surface reconstructions are generated. In these instances, the super-resolution images are used as an intermediate step for the cortical surface reconstruction.

As a non-limiting example, cortical surfaces are reconstructed using sub-millimeter isotropic resolution images output from the trained neural network(s). For instance, 0.7-mm isotropic T1-weighted images can be synthesized from 1 mm isotropic T1-weighted images using a very deep super-resolution ("VDSR") described in the present disclosure. The VDSR network may as one non-limiting example include a 20-layer convolutional neural network ("CNN"). The cortical surface reconstruction can include a 3D representation of the cortical surface, an estimate of cortical surface placement, an estimate of cortical thickness, or combinations thereof.

Even though cortical surface reconstruction from sub-millimeter image data has been demonstrated to be advantageous, its utilization has been so far limited to studies of healthy subjects, studies using ultra-high field MRI scanners, or studies that can tolerate prolonged scanning times needed for high-resolution data acquisition. The ability of the systems and methods described in the present disclosure to generate sub-millimeter isotropic resolution images from routinely acquired 1-mm isotropic resolution images without extra effort and cost provides a significant advantage that can increase the feasibility and impact of sub-millimeter cortical surface reconstruction for a wide variety of studies, especially in applications where lengthy scan times are not acceptable. For example, the systems and methods can be adapted to generate standard 1-mm isotropic resolution images from those with even lower resolution to further shorten the data acquisition for standard cortical surface reconstruction.

The systems and methods described in the present disclosure can also provide sub-millimeter cortical surface reconstruction on legacy data acquired at standard 1-mm isotropic resolution, including large-scale studies such as the ADNI, PPMI, and ABCD studies. As such, deep learning-enabled super-resolution may be leveraged as a discovery tool to uncover new features from sub-millimeter cortical surface reconstruction of large-scale neuroimaging data sets, making quantitative analysis of cortical morphology in the living human brain at high-resolution broadly accessible for investigating a wide range of developmental, neurodegenerative, and psychiatric disorders.

Further, the systems and methods described in the present disclosure can provide advantages for neurological applications of MRI in general. In radiological applications, higher-resolution brain images can improve the detection, monitoring, and assessment of small structures and pathologies, and are useful in multiplanar reformatting of data for improved viewing and longitudinal monitoring of disease states. For human neuroscience, by enabling higher-resolution functional imaging, the cerebral cortex can be studied as a 3D structure rather than as a 2D sheet, which can enable new classes of experiments investigating functional architecture at the level of cortical columns and layers. These advanced, emerging applications require accurate segmentation of the cortical surface, which can be provided by the super-resolution techniques described in the present disclosure. In addition to anatomical imaging, there is great potential for generating higher-resolution images for other MRI contrasts, such as functional MRI and diffusion MRI.

Referring now to FIG. 1, a flowchart is illustrated as setting forth the steps of an example method for generating super-resolution (e.g., sub-millimeter) images from lower resolution (e.g., 1 mm or greater than 1 mm) images using a deep learning algorithm, such as a neural network that implements deep learning (i.e., a deep neural network). From these super-resolution images, a cortical surface reconstruction is generated.

The method includes accessing standard-resolution magnetic resonance image data with a computer system, as indicated at step 102. These magnetic resonance image data can include images or k-space data, from which images can be reconstructed before being input to the deep learning algorithm. Accessing the data can include retrieving previously acquired data from a memory or other suitable data storage device or medium. Additionally or alternatively, accessing the data can include acquiring the data with an MRI system and transferring or otherwise communicating the data to the computer system, which may be a part of the MRI system. The standard-resolution magnetic resonance image data have a spatial resolution based on standard clinical scanning protocols. For instance, the standard-resolution magnetic resonance image data can have a spatial resolution of 1 mm or coarser. In some instances, the standard-resolution magnetic resonance image data may have an isotropic resolution.

A trained neural network (or other suitable machine learning algorithm) is then accessed with the computer system, as indicated at step 104. Accessing the trained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers) may be retrieved, constructed, or otherwise accessed.

The standard-resolution magnetic resonance image data are then input to the one or more trained neural networks, generating output as super-resolution images, as generally indicated at processing block 106. Advantageously, the neural network(s) can be trained on training data having one type of image contrast (e.g., T1-weighted images), but can then be applied to a different type of image contrast (e.g., T2-weighted images). In this way, the methods described in the present disclosure are generalizable across image contrasts. It will be appreciated that other combinations of magnetic resonance image contrasts are also possible.

Inputting the standard-resolution images can include upsampling the standard-resolution images to the target, higher resolution, as indicated at step 108. In these instances, the output of the trained neural network(s) is a residual image volume that contains the voxel-wise difference between the input, upsampled standard-resolution image volume and the native (i.e., desired) high-resolution image volume, as indicated at step 110. This residual image volume can be added to the upsampled image volume in order to produce the super-resolution images, as indicated at step 112. The super-resolution images may include images having a sub-millimeter resolution, which in some instances may be a sub-millimeter isotropic resolution.

The super-resolution images generated by inputting the standard-resolution magnetic resonance image data to the trained neural network(s) can then be displayed to a user, stored for later use or further processing, or both, as indicated at step 114.

When the super-resolution images depict a subject's brain, then a cortical surface reconstruction can be generated from the super-resolution images, as indicated at step 116. In general, the cortical surface reconstruction can include a 3D representation of the cortical surface as estimated from the super-resolution images. In this way, the cortical surface reconstruction can also include data regarding the cortical surface placement, cortical thickness, and so on. As an example, the cortical surface reconstruction data may include triangular meshes representing the cortical surface, which may include a number of vertices and faces that define a topology of the estimated cortical surface. The cortical surface reconstruction data can then be displayed to a user, stored for later use or further processing, or both, as indicated at step 118.

The cortical surface reconstruction can be generated by, for example, using a FreeSurfer (Dale A M et al. 1999; Fischl B et al. 1999; Fischl B 2012) (version v6.0) software.

Figure 2:
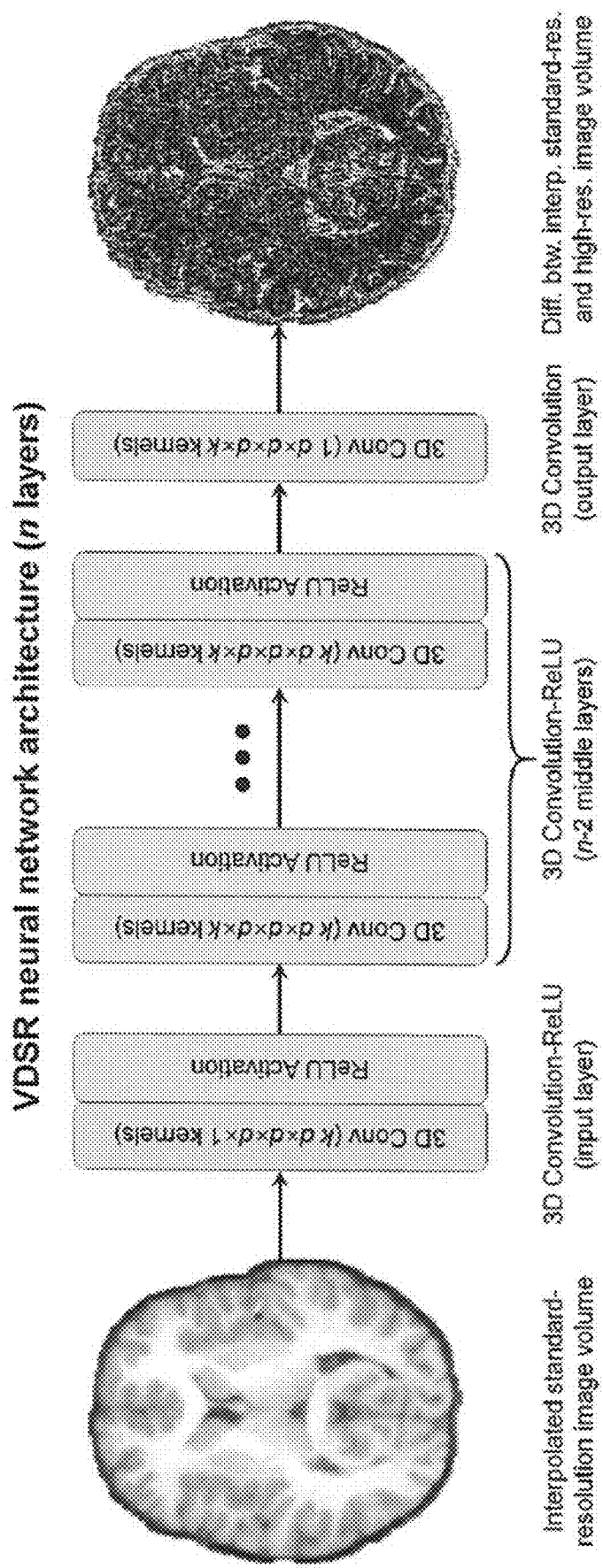
FIG. 2 is an example architecture of a 3-dimensional very deep convolutional neural network for super-resolution (VDSR) network.

Referring now to FIG. 2, an example neural network architecture that can be trained and implemented to generate super-resolution images from standard-resolution images is shown. In this example, the neural network is a 3D very-deep CNN for super-resolution ("VDSR"), which is trained to learn the transformation from upsampled nominally-high-resolution blocks to native high-resolution blocks on the same spatial resolution grid (e.g., a 0.7-mm isotropic voxel grid). The VDSR can be implemented using the Keras API with a Tensorflow backend, L2 loss, ReLU activation, 3×3×3 kernels, 15 layers, and 64 kernels at each layer.

As another example, the neural network architecture can implement a 3D U-Net to learn the mapping from upsampled images (e.g., 32×32×32 voxel blocks) to its residuals with respect to ground truth high-resolution images on the same spatial resolution grid (e.g., 0.7 mm isotropic voxel grid). The U-Net can be implemented using the Keras API with a Tensorflow backend, L2 loss, leaky ReLU activation, 3×3×3 kernels, 5 levels, and 64 kernels at the highest level.

For cortical surface reconstruction, an advantage of super-resolution images is that they have enhanced transition and image contrast at the gray matter-white matter boundaries and at the gray matter-cerebrospinal fluid ("CSF") boundaries. Applications that involve more complex image content (e.g., pathology) that or require much more aggressive up-sampling can benefit from more sophisticated CNNs (e.g., using a generative adversarial network) and ground truth high-resolution images with higher signal-to-noise ratio ("SNR") and spatial resolution that can be obtained.

Figure 3:
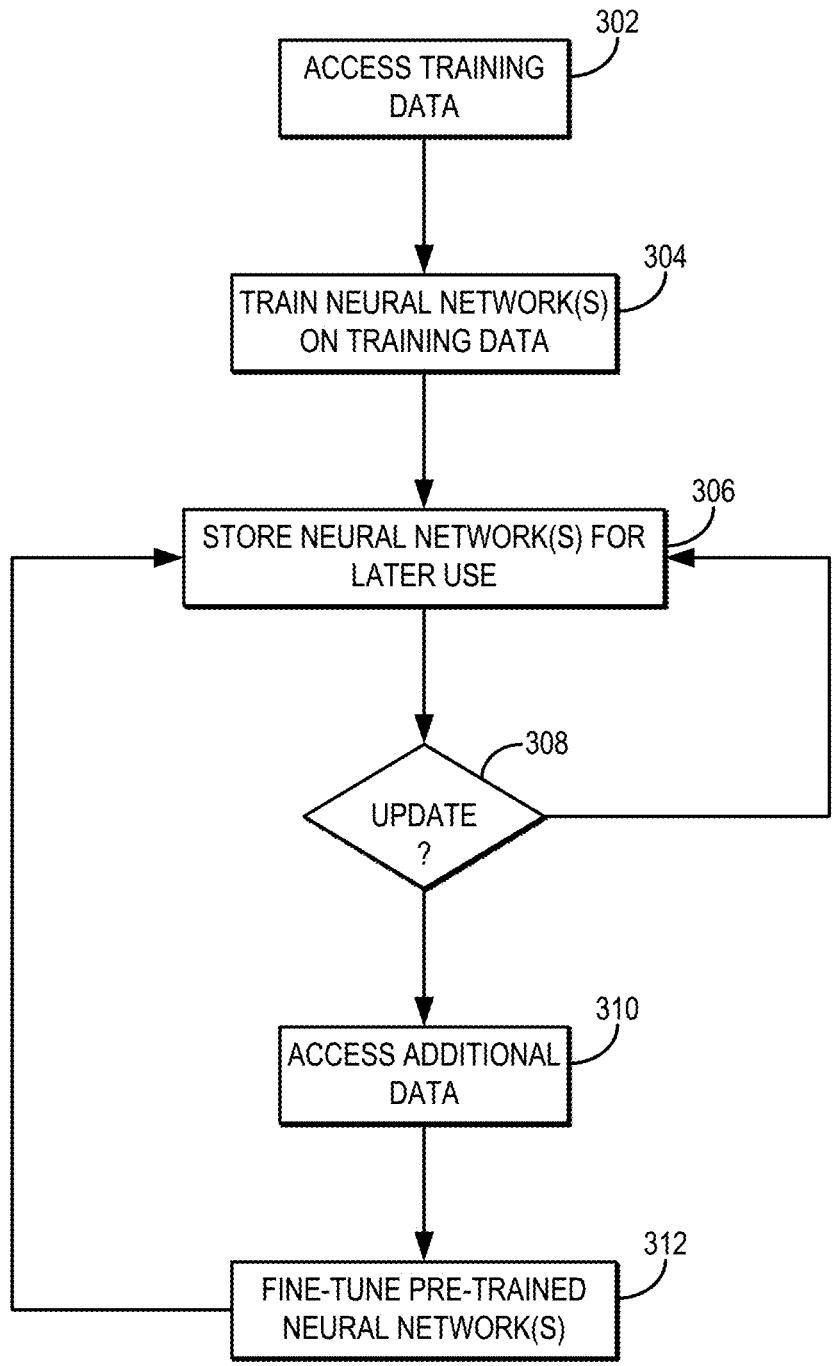
FIG. 3 is a flowchart of an example method for training a neural network to learn a mapping between upsampled images and native high-resolution images.

Referring now to FIG. 3, a flowchart is illustrated as setting forth the steps of an example method for training one or more neural networks (or other suitable machine learning algorithms) on training data, such that the one or more neural networks are trained to receive input as standard-resolution magnetic resonance images (e.g., images with a resolution of 1 mm or coarser) in order to generate output as super-resolution magnetic resonance images (e.g., images with a sub-millimeter resolution).

The method includes accessing training data with a computer system, as indicated at step 302. Accessing the training data can include retrieving previously acquired and arranged training data from a memory or other suitable data storage device or medium. Additionally or alternatively, accessing the training data may include acquiring data to be used as training data and transferring or otherwise communicating the data to the computer system. As one non-limiting example, acquiring data can include acquiring magnetic resonance images with an MRI system.

As one example, the training data can include standard-resolution magnetic resonance images and upsampled magnetic resonance images. The standard-resolution images, for instance, can have a resolution that is 1 mm, which may be 1 mm isotropic or otherwise, or that is coarser than 1 mm. The upsampled resolution images are generated from the standard-resolution images by upsampling the standard-resolution images. As one non-limiting example, the upsampled images can be generated using a cubic spline interpolation or other suitable upsampling technique. Preferably, the upsampled imaged are upsampled to the same target resolution of the super-resolution images to be generated when using the neural network. Thus, in general, the spatial resolution of the upsampled images is a sub-millimeter resolution.

Advantageously, as described above, the neural network can be generalized across image contrasts. As one example, the neural network can be trained on T1-weighted data, but then applied to T2-weighted data.

A neural network is then trained on the training data, as indicated at step 304. In general, the neural network can be trained by optimizing network parameters (e.g., weights, biases, or both) based on minimizing a loss function. As one non-limiting example, the loss function may include a mean squared error loss function. The neural network can be trained, for instance, to learn the transformation from upsampled images to a native high-resolution block on the same spatial resolution grid (e.g., a 0.7-mm isotropic voxel grid).

The one or more trained neural networks are then stored for later use, as indicated at step 306. Storing the neural network(s) may include storing network parameters (e.g., weights, biases, or both), which have been computed or otherwise estimated by training the neural network(s) on the training data. Storing the trained neural network(s) may also include storing the particular neural network architecture to be implemented. For instance, data pertaining to the layers in the neural network architecture (e.g., number of layers, type of layers, ordering of layers, connections between layers) may be stored.

In some instances, a pre-trained neural network can also be optimized to a new dataset by fine-tuning the network parameter values learned from a baseline training dataset using a small amount of target data, as determined at decision block 308. In these instances, the additional data are accessed at step 310 and used to fine-tune or otherwise update the pre-trained neural network, as indicated at step 312. This approach is advantageous in accounting for deviations between the training data and the testing data, as well as in reducing additional effort and time needed to collect new, large training datasets for a new application.

As an example, a custom neural network could be built for each MRI scanner and each protocol using data acquired on a few subjects by initializing with a pre-trained network. Data can be also acquired on small numbers of patients, children, or any other group of subjects for whom long acquisitions are challenging, in order to fine-tune a neural network that was pre-trained on data from healthy young adults. For existing large-scale datasets with standard-resolution anatomical MR images, a pre-trained neural network can be fine-tuned using newly acquired data from a few subjects which can be then applied to data from thousands of subjects.

In one example study, high-resolution (0.7-mm isotropic nominal) T1-weighted images of 30 unrelated subjects (10 for evaluation, 20 for training) were selected from the Human Connectome Project. Low-resolution (1-mm isotropic) images were generated by blurring/anti-aliasing then down-sampling the native high-resolution images with tri-linear interpolation. The low-resolution T1-weighted images were then up-sampled to nominally-high-resolution using cubic spline interpolation, which served as the input of the CNN. The native high-resolution images served as the output of the CNN. Blocks of 32×32×32 voxel size were extracted (stride of 16) from all subjects (40,000 blocks from 20 training subjects).

A 3D VDSR network was used to learn the transformation from the up-sampled nominally-high-resolution block to the native high-resolution block on the same 0.7-mm isotropic voxel grid. VDSR was implemented using the Keras API with a Tensorflow backend, L2 loss, ReLU activation, 3×3×3 kernels, 15 layers, and 64 kernels at each layer. The training was performed on 15 subjects and validated on 5 using an NVidia V100 GPU for 20 epochs (~7 hours).

The learned VDSR parameters were applied to 10 new subjects not included in the training process. FreeSurfer reconstruction was performed on the native, nominal, and synthesized high-resolution T1-weighted images with a "hires" option. The vertex-wise displacement of the estimated GM-WM and GM-CSF surfaces and the cortical thickness compared to the ground truth were computed. The displacement maps of the 10 subjects were co-registered to FreeSurfer's "fsaverage" space and averaged.

Figures 4A, 4B, 4C:
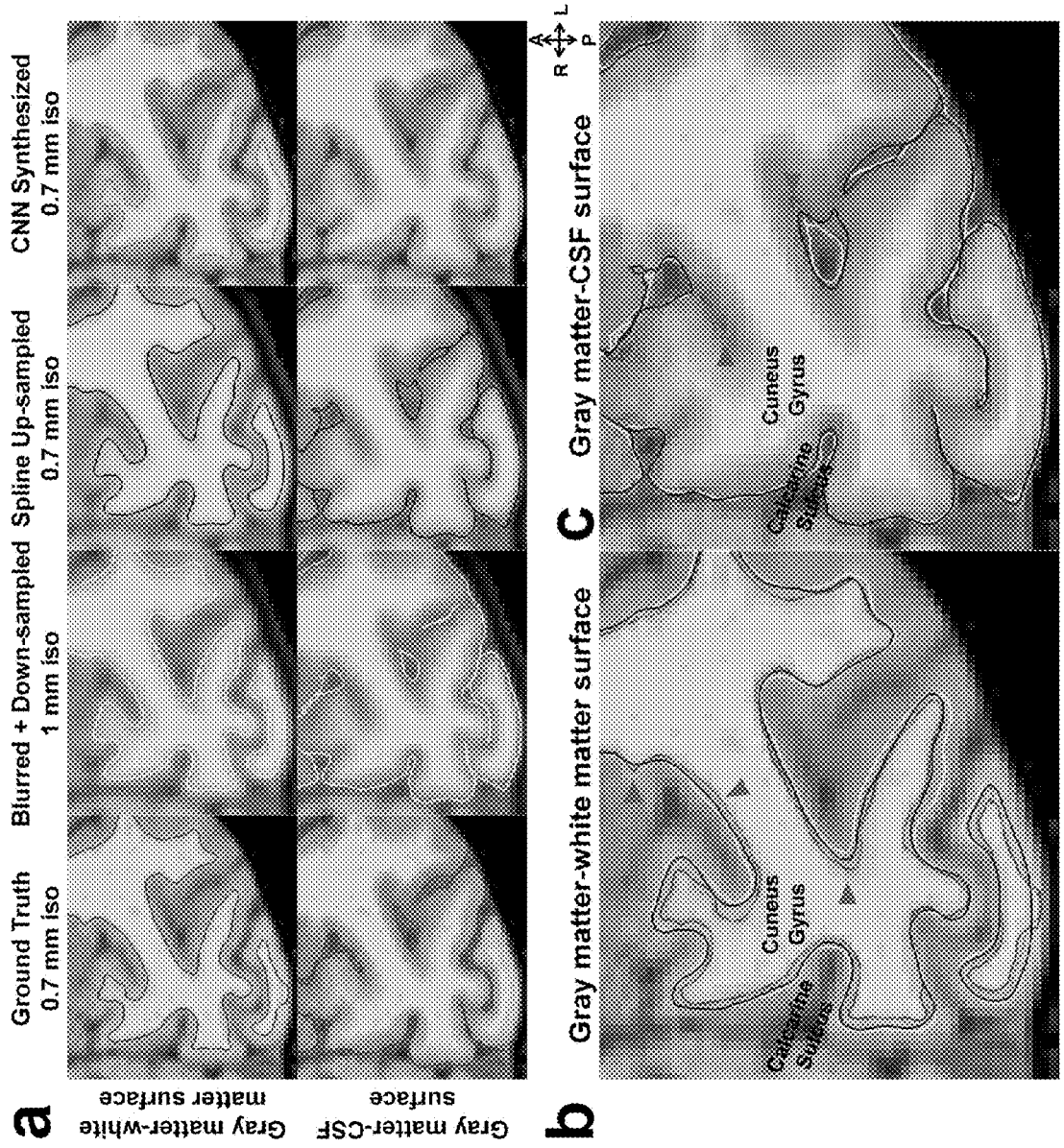
FIGS. 4A-4C show example images having native high resolution, down sampled copies of the native high-resolution images, upsampled copies of the down sampled images, and synthesized super-resolution images, including contours associated with gray-white boundaries (FIG. 4B) and gray-CSF boundaries (FIG. 4C).

The synthesized high-resolution T1-weighted images were visually comparable to the native high-resolution images and contained more textural detail compared to the low-resolution and up-sampled nominally-high-resolution images. Examples of regions in the primary visual cortex are shown in FIG. 4A. The synthesized T1-weighted images had substantially lower difference and higher structural similarity indices than the up-sampled nominally-high-resolution images compared to ground truth.

FIGS. 4B and 4C demonstrate that the estimated GM-WM and GM-CSF surfaces, respectively, reconstructed from the synthesized high-resolution T1-weighted images (green contour) were highly similar to those reconstructed from ground truth (red contour) and markedly improved upon the low-resolution and up-sampled nominally-high-resolution images, especially the GM-WM surface.

The vertex-wise displacement of the estimated GM-WM and GM-CSF surfaces and cortical thickness between the synthesized high-resolution images and ground truth were substantially smaller than those between the up-sampled nominally-high-resolution images and ground truth at the single-subject level and when averaged across 10 subjects.

In another example study, high-resolution (0.7-mm isotropic) T1-weighted and T2-weighted images and corresponding T1-weighted/T2-weighted intensity ratio maps (as a measure of myelin content) of 100 subjects (64 for training, 16 for validation, 20 for evaluation) were selected from the Human Connectome Project WU-Minn-Ox Consortium public database.

The T1-weighted images were acquired using a 3-dimensional (3D) magnetization-prepared rapid gradient-echo (MPRAGE) sequence with the following parameter values: repetition time (TR)=2,400 ms, echo time (TE)=2.14 ms, inversion time (TI)=1000 ms, flip angle (FA)=8°, 256 sagittal slices, slice thickness=0.7 mm, field of view (FOV) =224 mm×224 mm, matrix size=320×320, resolution=0.7 mm isotropic, echo spacing=7.6 ms, bandwidth=210 Hz/pixel, generalized autocalibrating partial parallel acquisition (GRAPPA) factor=2, acquisition time=7.7 minutes×2 separate repetitions. The two repetitions were corrected for field inhomogeneity and gradient nonlinearity distortions and intensity bias, co-registered and averaged.

The T2-weighted images were acquired using a variable-flip-angle turbo-spin-echo (SPACE) sequence with 0.7 mm isotropic resolution (same matrix, FOV and slices as the T1-weighted images) and the following parameter values: TR=3,200 ms, TE=565 ms, bandwidth=744 Hz/pixel, GRAPPA factor=2, total turbo factor=314, echo train length=1,105, acquisition time=8.4 minutes×2 separate repetitions. The two repetitions were corrected for field inhomogeneity and gradient nonlinearity distortions and intensity bias, co-registered and averaged. The T1-weighted and T2-weighted images for each subject were co-registered.

High-resolution (0.75-mm isotropic) T1-weighted images of 16 healthy subjects (4 for training, 2 for validation, 10 for evaluation) were also acquired on a whole-body 7-Tesla scanner. The data were acquired using a 3D multi-echo MPRAGE (ME-MPRAGE) sequence with a 13 ms FOCI adiabatic inversion pulse and the following parameter values: TR=2,530 ms, TE=1.76/3.90 ms, TI=1,100 ms, FA=7°, 208 sagittal slices, slice thickness=0.75 mm, FOV=240 mm×240 mm, matrix size=320×320, resolution=0.75 mm isotropic, echo spacing=6.2 ms, bandwidth=651 Hz/pixel, GRAPPA factor=2 with 32 reference lines, acquisition time=7.4 minutes.

For the 7-Tesla data, spatially varying intensity biases were corrected using a unified segmentation routine implementation in the Statistical Parametric Mapping (SPM, https://www.fil.ion.ucl.ac.uk/spm) software with a full-width at half-maximum (FWHM) of 18 mm and a sampling distance of 2 mm.

For the 3-Tesla HCP T1-weighted and T2-weighted data, and for the 7-Tesla T1-weighted data, standard-resolution (1-mm isotropic) images were generated by anti-alias filtering and then down-sampling the native high-resolution images with trilinear interpolation. The standard-resolution images were then upsampled to the respective native high-resolutions using a cubic spline interpolation.

Brain masks were created from standard-resolution T1-weighted images by performing the FreeSurfer (Dale A M et al. 1999; Fischl B et al. 1999; Fischl B 2012) (version v6.0) automatic reconstruction processing for the first five preprocessing steps (FreeSurfer's "recon-all" function with the "-autoreconl" option). The brain masks derived from the standard-resolution data were upsampled to the respective native high-resolutions using nearest neighbor interpolation.

To standardize the input and output image volumes for the CNN, the intensities of the upsampled standard-resolution images and native high-resolution images of each subject were subtracted by the mean intensity and then divided by the standard deviation of the image intensities of the brain voxels taken from the upsampled standard-resolution images. These intensity-standardized images were then brain-masked.

A 3D VDSR network was adopted to synthesize sub-millimeter isotropic resolution image volumes from standard 1-mm isotropic resolution image volumes. The input to the VDSR network was the upsampled standard-resolution image volume (interpolated to the targeted high resolution). The output of the VDSR network was a residual image volume containing the voxel-wise difference between the input upsampled standard-resolution image volume and the native high-resolution image volume, which could be added to the input to generate the synthesized high-resolution image volume.

As described above, the VDSR network has a network architecture that includes stacked convolutional filters paired with nonlinear activation functions. The p-layer VDSR network includes an input layer of paired 3D convolution (k kernels of size d×d×d×1 voxels, stride of 1×1×1 voxel) and rectified linear unit (ReLU) nonlinear activation, n−2 middle layers of paired 3D convolution (k kernels of size d×d×d×1 voxels, stride of 1×1×1 voxel) and ReLU activation, and an output 3D convolutional layer (one kernel of size d×d×d×k voxels, stride of 1×1×1 voxel). The output layer excludes ReLU activation so that the output would include both positive and negative values. Parameter value settings of n=20, k=64, d=3 were adopted.

The VDSR network was implemented and trained using the Keras API with a Tensorflow backend using a V100 graphics processing unit (GPU, 16G memory) (NVidia, Santa Clara, Calif.). Network parameters were optimized by minimizing the mean squared error using stochastic gradient descent with an Adam optimizer. All 3D convolutional kernels were randomly initialized as described by K. He, et al., in "Delving Deep into Rectifiers: Surpassing Human-Level Performance on ImageNet Classification," In *Proceedings of the IEEE International Conference on Computer Vision,* 2015; pp. 1026-1034. Because of the limited GPU memory available, the input and output image volumes of each subject were divided into 12 blocks of 81×81×81 voxels.

For both 3-Tesla HCP T1-weighted and T2-weighted data, the training was performed on 64 subjects and validated on a distinct set of 16 subjects for 40 epochs (~27 hours). The learning rate was 0.001 for the first 20 epochs, after which the network approached convergence, and 0.0001 for the last 20 epochs.

To experiment with transfer learning to demonstrate the reduced requirements on training data needed for a new application, another two VDSR networks, initialized with parameters learned from the HCP 3-Tesla T1-weighted images were further fine-tuned on the 3-Tesla HCP T2-weighted images and 7-Tesla T1-weighted images from 6 subjects (4 for training, 2 for validation) using a low learning rate of 0.0001 for only 5 epochs (~3 hours).

Referring now to FIG. 4, an example of a system 400 for generating super-resolution-based cortical surface reconstructions from standard-resolution magnetic resonance images in accordance with some embodiments of the systems and methods described in the present disclosure is shown. As shown in FIG. 4, a computing device 450 can receive one or more types of data (e.g., standard-resolution magnetic resonance image data, upsampled image data, native high-resolution image data) from image source 402, which may be a magnetic resonance image source. In some embodiments, computing device 450 can execute at least a portion of a super-resolution cortical surface reconstruction system 404 to generate super-resolution-based cortical surface reconstructions from standard-resolution magnetic resonance images or other data received from the image source 402.

Additionally or alternatively, in some embodiments, the computing device 450 can communicate information about data received from the image source 402 to a server 452 over a communication network 454, which can execute at least a portion of the super-resolution cortical surface reconstruction system. In such embodiments, the server 452 can return information to the computing device 450 (and/or any other suitable computing device) indicative of an output of the super-resolution cortical surface reconstruction system 404.

In some embodiments, computing device 450 and/or server 452 can be any suitable computing device or combination of devices, such as a desktop computer, a laptop computer, a smartphone, a tablet computer, a wearable computer, a server computer, a virtual machine being executed by a physical computing device, and so on. The computing device 450 and/or server 452 can also reconstruct images from the data.

In some embodiments, image source 402 can be any suitable source of image data (e.g., measurement data, images reconstructed from measurement data), such as an MRI system, another computing device (e.g., a server storing image data), and so on. In some embodiments, image source 402 can be local to computing device 450. For example, image source 402 can be incorporated with computing device 450 (e.g., computing device 450 can be configured as part of a device for capturing, scanning, and/or storing images). As another example, image source 402 can be connected to computing device 450 by a cable, a direct wireless link, and so on. Additionally or alternatively, in some embodiments, image source 402 can be located locally and/or remotely from computing device 450, and can communicate data to computing device 450 (and/or server 452) via a communication network (e.g., communication network 454).

In some embodiments, communication network 454 can be any suitable communication network or combination of communication networks. For example, communication network 454 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), a wired network, and so on. In some embodiments, communication network 454 can be a local area network, a wide area network, a public network (e.g., the Internet), a private or semi-private network (e.g., a corporate or university intranet), any other suitable type of network, or any suitable combination of networks. Communications links shown in FIG. 4 can each be any suitable communications link or combination of communications links, such as wired links, fiber optic links, Wi-Fi links, Bluetooth links, cellular links, and so on.

Figure 5:
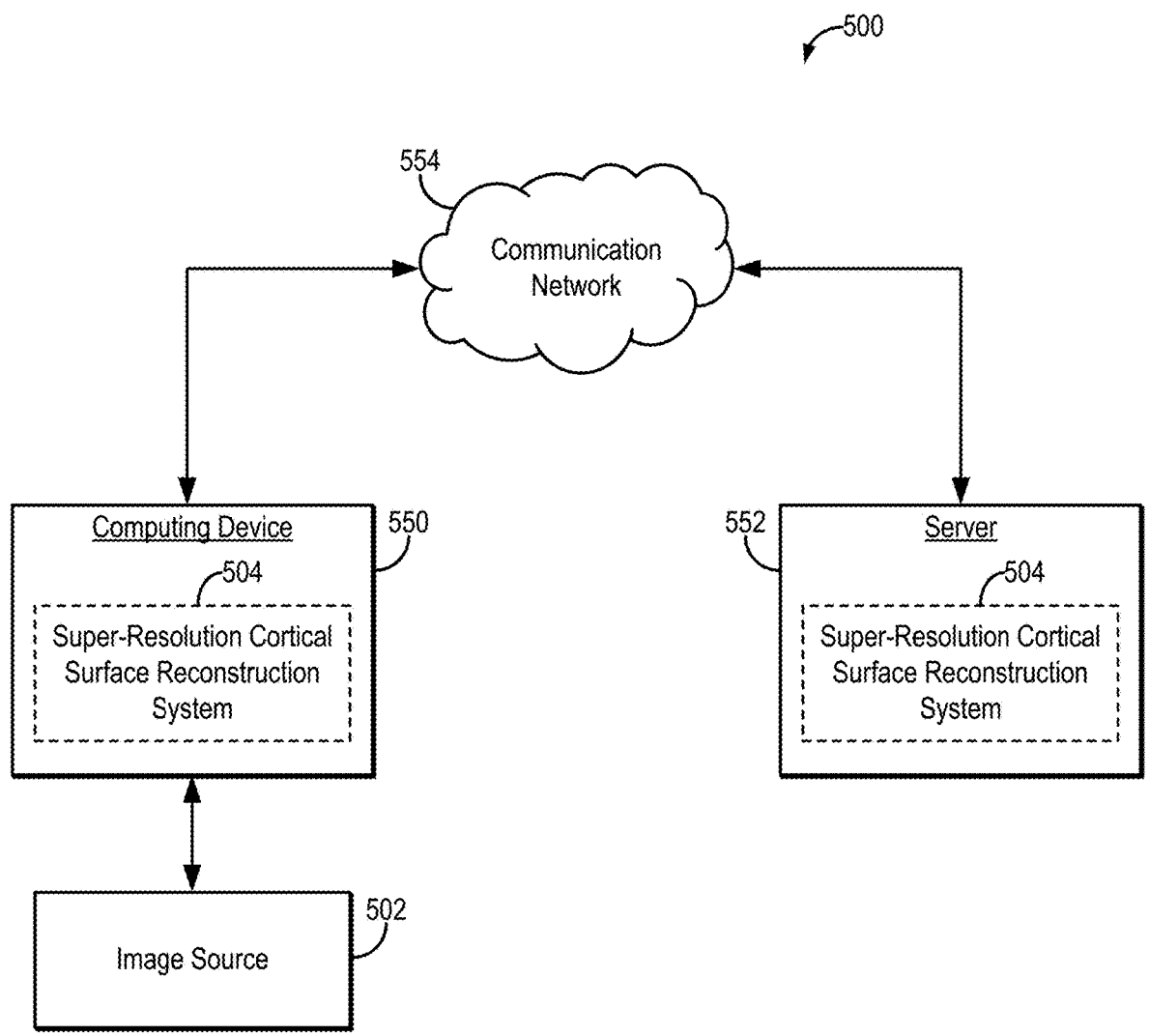
FIG. 5 is a block diagram of an example system for generating super-resolution-based cortical surface reconstructions from standard-resolution images.

Referring now to FIG. 5, an example of hardware 500 that can be used to implement image source 402, computing device 450, and server 452 in accordance with some embodiments of the systems and methods described in the present disclosure is shown. As shown in FIG. 5, in some embodiments, computing device 450 can include a processor 502, a display 504, one or more inputs 506, one or more communication systems 508, and/or memory 510. In some embodiments, processor 502 can be any suitable hardware processor or combination of processors, such as a central processing unit ("CPU"), a graphics processing unit ("GPU"), and so on. In some embodiments, display 504 can include any suitable display devices, such as a computer monitor, a touchscreen, a television, and so on. In some embodiments, inputs 506 can include any suitable input devices and/or sensors that can be used to receive user input, such as a keyboard, a mouse, a touchscreen, a microphone, and so on.

In some embodiments, communications systems 508 can include any suitable hardware, firmware, and/or software for communicating information over communication network 454 and/or any other suitable communication networks. For example, communications systems 508 can include one or more transceivers, one or more communication chips and/or chip sets, and so on. In a more particular example, communications systems 508 can include hardware, firmware and/or software that can be used to establish a Wi-Fi connection, a Bluetooth connection, a cellular connection, an Ethernet connection, and so on.

In some embodiments, memory 510 can include any suitable storage device or devices that can be used to store instructions, values, data, or the like, that can be used, for example, by processor 502 to present content using display 504, to communicate with server 452 via communications system(s) 508, and so on. Memory 510 can include any suitable volatile memory, non-volatile memory, storage, or any suitable combination thereof. For example, memory 510 can include RAM, ROM, EEPROM, one or more flash drives, one or more hard disks, one or more solid state drives, one or more optical drives, and so on. In some embodiments, memory 510 can have encoded thereon, or otherwise stored therein, a computer program for controlling operation of computing device 450. In such embodiments, processor 502 can execute at least a portion of the computer program to present content (e.g., images, user interfaces, graphics, tables), receive content from server 452, transmit information to server 452, and so on.

In some embodiments, server 452 can include a processor 512, a display 514, one or more inputs 516, one or more communications systems 518, and/or memory 520. In some embodiments, processor 512 can be any suitable hardware processor or combination of processors, such as a CPU, a GPU, and so on. In some embodiments, display 514 can include any suitable display devices, such as a computer monitor, a touchscreen, a television, and so on. In some embodiments, inputs 516 can include any suitable input devices and/or sensors that can be used to receive user input, such as a keyboard, a mouse, a touchscreen, a microphone, and so on.

In some embodiments, communications systems 518 can include any suitable hardware, firmware, and/or software for communicating information over communication network 454 and/or any other suitable communication networks. For example, communications systems 518 can include one or more transceivers, one or more communication chips and/or chip sets, and so on. In a more particular example, communications systems 518 can include hardware, firmware and/or software that can be used to establish a Wi-Fi connection, a Bluetooth connection, a cellular connection, an Ethernet connection, and so on.

In some embodiments, memory 520 can include any suitable storage device or devices that can be used to store instructions, values, data, or the like, that can be used, for example, by processor 512 to present content using display 514, to communicate with one or more computing devices 450, and so on. Memory 520 can include any suitable volatile memory, non-volatile memory, storage, or any suitable combination thereof. For example, memory 520 can include RAM, ROM, EEPROM, one or more flash drives, one or more hard disks, one or more solid state drives, one or more optical drives, and so on. In some embodiments, memory 520 can have encoded thereon a server program for controlling operation of server 452. In such embodiments, processor 512 can execute at least a portion of the server program to transmit information and/or content (e.g., data, images, a user interface) to one or more computing devices 450, receive information and/or content from one or more computing devices 450, receive instructions from one or more devices (e.g., a personal computer, a laptop computer, a tablet computer, a smartphone), and so on.

In some embodiments, image source 402 can include a processor 522, one or more image acquisition systems 524, one or more communications systems 526, and/or memory 528. In some embodiments, processor 522 can be any suitable hardware processor or combination of processors, such as a CPU, a GPU, and so on. In some embodiments, the one or more image acquisition systems 524 are generally configured to acquire data, images, or both, and can include an MRI system. Additionally or alternatively, in some embodiments, one or more image acquisition systems 524 can include any suitable hardware, firmware, and/or software for coupling to and/or controlling operations of an MRI system. In some embodiments, one or more portions of the one or more image acquisition systems 524 can be removable and/or replaceable.

Note that, although not shown, image source 402 can include any suitable inputs and/or outputs. For example, image source 402 can include input devices and/or sensors that can be used to receive user input, such as a keyboard, a mouse, a touchscreen, a microphone, a trackpad, a trackball, and so on. As another example, image source 402 can include any suitable display devices, such as a computer monitor, a touchscreen, a television, etc., one or more speakers, and so on.

In some embodiments, communications systems 526 can include any suitable hardware, firmware, and/or software for communicating information to computing device 450 (and, in some embodiments, over communication network 454 and/or any other suitable communication networks). For example, communications systems 526 can include one or more transceivers, one or more communication chips and/or chip sets, and so on. In a more particular example, communications systems 526 can include hardware, firmware and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 528 can include any suitable storage device or devices that can be used to store instructions, values, data, or the like, that can be used, for example, by processor 522 to control the one or more image acquisition systems 524, and/or receive data from the one or more image acquisition systems 524; to images from data; present content (e.g., images, a user interface) using a display; communicate with one or more computing devices 450; and so on. Memory 528 can include any suitable volatile memory, non-volatile memory, storage, or any suitable combination thereof. For example, memory 528 can include RAM, ROM, EEPROM, one or more flash drives, one or more hard disks, one or more solid state drives, one or more optical drives, and so on. In some embodiments, memory 528 can have encoded thereon, or otherwise stored therein, a program for controlling operation of image source 402. In such embodiments, processor 522 can execute at least a portion of the program to generate images, transmit information and/or content (e.g., data, images) to one or more computing devices 450, receive information and/or content from one or more computing devices 450, receive instructions from one or more devices (e.g., a personal computer, a laptop computer, a tablet computer, a smartphone, etc.), and so on.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

Figure 6:
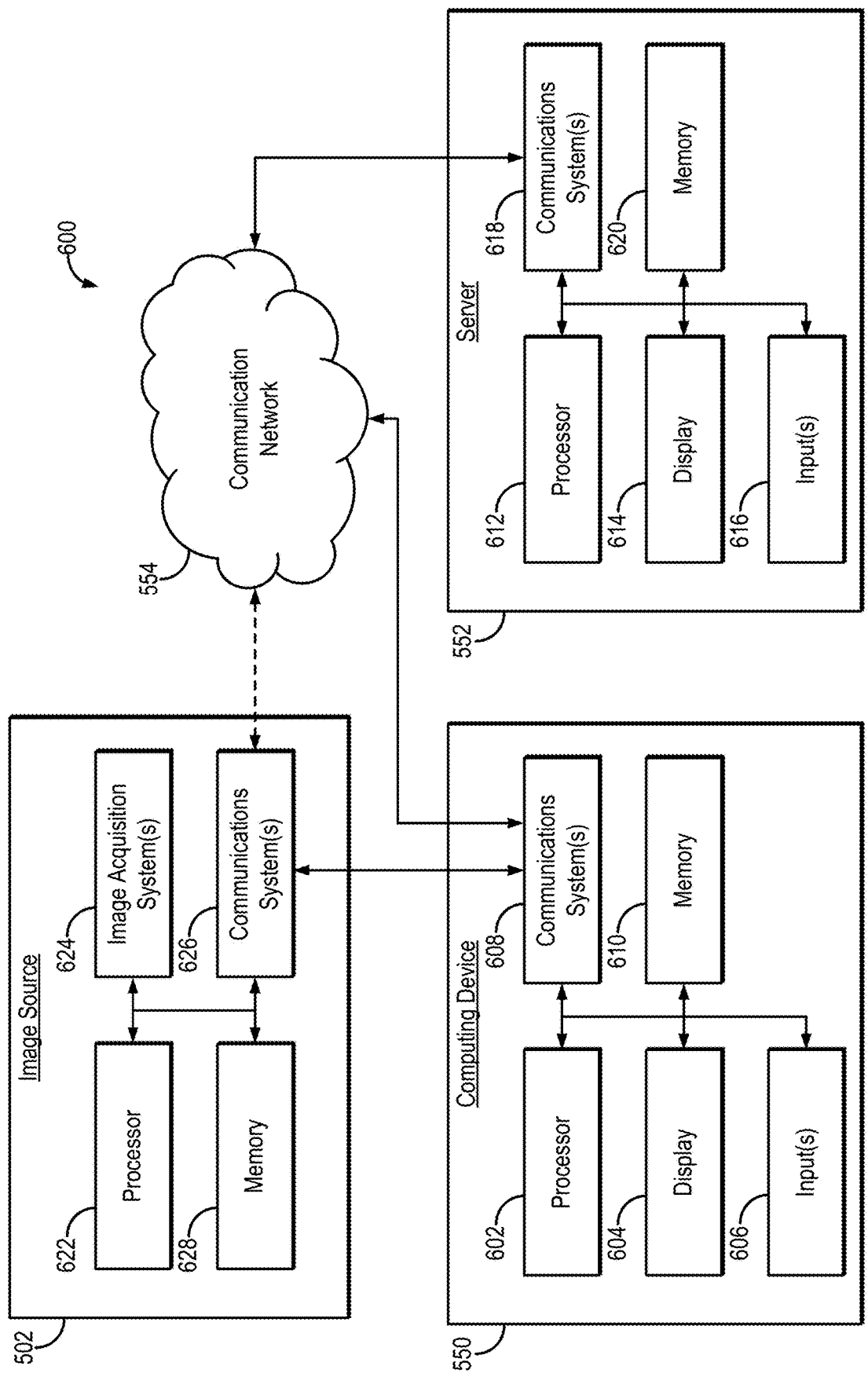
FIG. 6 is a block diagram of example components that can implement the system of FIG. 5.
Figure 7:
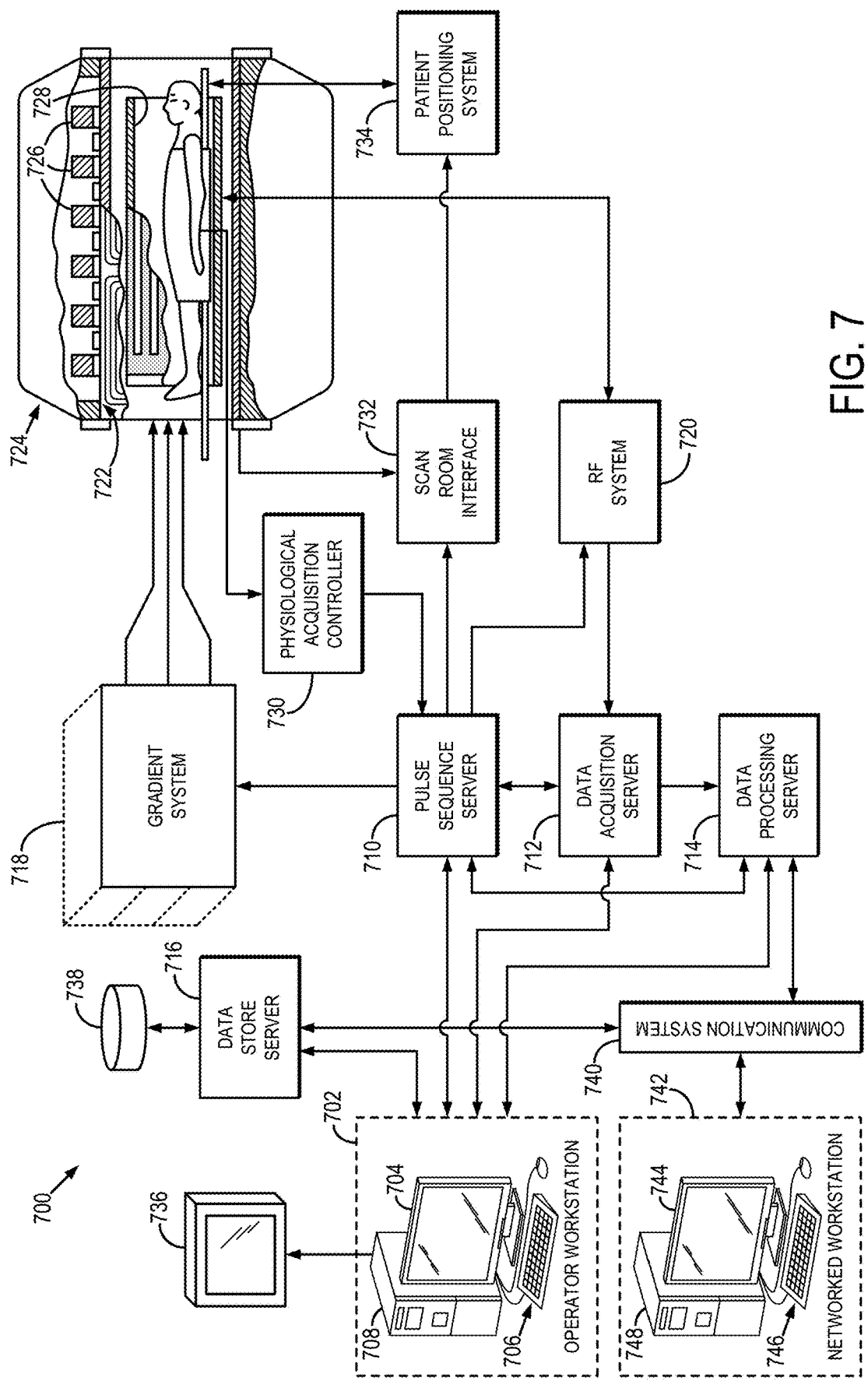
FIG. 7 is a block diagram of an example MRI system that can implement the methods described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has described one or more preferred embodiments, and it should be appreciated that many equivalents, alternatives, variations, and modifications, aside from those expressly stated, are possible and within the scope of the invention.

The invention claimed is:

1. A method for generating a cortical surface reconstruction from standard-resolution magnetic resonance images, the method comprising:
   (a) accessing standard-resolution magnetic resonance image data with a computer system, wherein the standard-resolution magnetic resonance image data depict a brain of a subject;
   (b) generating upsampled image data with the computer system by upsampling the standard-resolution magnetic resonance image data to a target spatial resolution that is finer than the standard resolution;
   (c) accessing a neural network with the computer system, wherein the neural network has been trained on training data to learn a mapping from upsampled image data to native high-resolution image data, the training data including
   first image data having a first spatial resolution representative of a native high resolution,
   second image data having a second spatial resolution that is coarser than the first spatial resolution, wherein the second image data are generated by downsampling the first image data, and
   third image data having a third spatial resolution representative of an upsampled high resolution, wherein the third image data are generated by upsampling the second image data;
   (d) inputting the upsampled image data to the neural network using the computer system, generating output as residual image data that represent image differences relative to the upsampled image data; and
   (e) generating super-resolution image data by combining the upsampled image data and the residual image data.

2. The method of claim 1, wherein the standard-resolution magnetic resonance image data have a spatial resolution coarser than or equal to 1 millimeter isotropic.

3. The method of claim 1, wherein the super-resolution image data have a spatial resolution finer than 1 millimeter isotropic.

4. The method of claim 1, wherein the neural network is a convolutional neural network.

5. The method of claim 4, wherein the convolutional neural network implements deep learning.

6. The method of claim 4, wherein the convolutional neural network is a very-deep super-resolution (VDSR) neural network.

7. The method of claim 1, wherein the upsampled image data are generated using a cubic spline interpolation.

8. The method of claim 1, further comprising generating a cortical surface reconstruction from the super-resolution image data, wherein the cortical surface reconstruction represents a three-dimensional representation of a cortical surface of the brain of the subject.

9. The method of claim 8, further comprising computing cortical thickness values for the brain of the subject based on the cortical surface reconstruction.

10. The method of claim 1, wherein the neural network is a pre-trained neural network and step (c) comprises fine-tuning the pre-trained neural network using additional training data.

11. The method of claim 1, wherein the neural network is configured to generate super-resolution magnetic resonance images from lower resolution magnetic resonance images.

12. The method of claim 1, wherein the neural network is trained using the training data by minimizing a loss function to learn a mapping between the native high resolution and the upsampled high resolution.

* * * * *

UNITED STATES PATENT AND TRADEMARK OFFICE
CERTIFICATE OF CORRECTION

| | | |
|---|---|---|
| PATENT NO. | : 11,449,989 B2 | Page 1 of 1 |
| APPLICATION NO. | : 16/831061 | |
| DATED | : September 20, 2022 | |
| INVENTOR(S) | : Qiyuan Tian et al. | |

It is certified that error appears in the above-identified patent and that said Letters Patent is hereby corrected as shown below:

In the Specification

Column 1, Line 25, "N5096056" should be --NS096056--.

Signed and Sealed this
Thirteenth Day of January, 2026

John A. Squires
*Director of the United States Patent and Trademark Office*